(12) United States Patent
Khandani

(10) Patent No.: US 10,333,593 B2
(45) Date of Patent: Jun. 25, 2019

(54) SYSTEMS AND METHODS OF ANTENNA DESIGN FOR FULL-DUPLEX LINE OF SIGHT TRANSMISSION

(71) Applicant: Amir Keyvan Khandani, Kitchener (CA)

(72) Inventor: Amir Keyvan Khandani, Kitchener (CA)

(73) Assignee: Amir Keyvan Khandani, Kitchener (CA)

( * ) Notice: Subject to any disclaimer, the term of this patent is extended or adjusted under 35 U.S.C. 154(b) by 144 days.

(21) Appl. No.: 15/585,130

(22) Filed: May 2, 2017

(65) Prior Publication Data
US 2017/0317809 A1 Nov. 2, 2017

Related U.S. Application Data

(60) Provisional application No. 62/330,687, filed on May 2, 2016.

(51) Int. Cl.
*H01Q 19/10* (2006.01)
*H04B 7/0426* (2017.01)
(Continued)

(52) U.S. Cl.
CPC ............... *H04B 7/043* (2013.01); *H01Q 1/36* (2013.01); *H01Q 9/16* (2013.01); *H01Q 9/28* (2013.01);
(Continued)

(58) Field of Classification Search
CPC ........ H01Q 19/108; H01Q 21/06; H01Q 9/28; H01Q 11/08; H01Q 19/13; H01Q 19/132;
(Continued)

(56) References Cited

U.S. PATENT DOCUMENTS 2,995,752 A * 8/1961 Shyhalla .................. G01S 1/02
342/420
3,082,421 A 3/1963 Nicholas
(Continued)

FOREIGN PATENT DOCUMENTS

EP 2180623 4/2010
GB 1091437 11/1967
(Continued)

OTHER PUBLICATIONS

Chen, B., et al., "Quantization Index Modulation: A Class of Provably Good Methods for Digital Watermarking and Information Embedding", IEEE Transaction on Information Theory, vol. 47, No. 4, May 2001, pp. 1423-1443.
(Continued)

*Primary Examiner* — Tho G Phan
(74) *Attorney, Agent, or Firm* — Invention Mine LLC

(57) ABSTRACT

Methods and apparatuses are described for communicating primary signals over a high-speed primary channel, the primary signals having a beam pattern having a full lobe at a center of an axis of propagation and communicating auxiliary signals over a low-speed auxiliary channel, the auxiliary signals having a decoupled beam pattern having a null at the center of axis of propagation, the high-speed primary channel and low-speed auxiliary channel operating in full duplex.

20 Claims, 19 Drawing Sheets

(51) Int. Cl.
*H01Q 9/28* (2006.01)
*H01Q 21/06* (2006.01)
*H04L 5/14* (2006.01)
*H01Q 9/16* (2006.01)
*H01Q 9/30* (2006.01)
*H01Q 9/44* (2006.01)
*H01Q 11/08* (2006.01)
*H01Q 19/13* (2006.01)
*H01Q 19/19* (2006.01)
*H01Q 21/24* (2006.01)
*H01Q 1/36* (2006.01)
*H01Q 19/17* (2006.01)
*H01Q 19/28* (2006.01)
*H01Q 25/00* (2006.01)
*H01F 5/00* (2006.01)
*H01F 17/00* (2006.01)
*H03M 1/74* (2006.01)

(52) U.S. Cl.
CPC ............... *H01Q 9/30* (2013.01); *H01Q 9/44* (2013.01); *H01Q 11/08* (2013.01); *H01Q 19/108* (2013.01); *H01Q 19/13* (2013.01); *H01Q 19/132* (2013.01); *H01Q 19/17* (2013.01); *H01Q 19/19* (2013.01); *H01Q 19/28* (2013.01); *H01Q 21/06* (2013.01); *H01Q 21/24* (2013.01); *H01Q 25/007* (2013.01); *H04L 5/14* (2013.01); *H01F 5/003* (2013.01); *H01F 2017/0026* (2013.01); *H03M 1/745* (2013.01)

(58) Field of Classification Search
CPC .......... H01Q 19/28; H01Q 1/36; H01Q 21/24; H01Q 25/007; H01Q 9/16; H01Q 9/30; H01Q 9/44; H04L 5/14; H01F 2017/0026; H01F 5/003; H03M 1/745; H04B 7/043
See application file for complete search history.

(56) References Cited

U.S. PATENT DOCUMENTS

| | | | | |
|---|---|---|---|---|
| 3,184,747 | A * | 5/1965 | Kach | H01Q 11/08 343/833 |
| 3,725,920 | A | 4/1973 | Kupfer | |
| 3,965,475 | A * | 6/1976 | Deerkoski | G01S 13/4409 342/374 |
| 4,268,727 | A | 5/1981 | Agrawal | |
| 4,343,005 | A * | 8/1982 | Han | H01Q 1/288 343/779 |
| 4,750,165 | A | 6/1988 | Champagne | |
| 5,383,224 | A | 1/1995 | Mizoguchi | |
| 5,388,124 | A | 2/1995 | Laroia | |
| 5,691,978 | A | 11/1997 | Kenworthy | |
| 5,805,116 | A | 9/1998 | Morley | |
| 6,255,997 | B1 * | 7/2001 | Ratkorn | H01Q 15/147 343/781 R |
| 6,317,092 | B1 | 11/2001 | De Schweinitz | |
| 6,608,864 | B1 | 8/2003 | Strait | |
| 6,621,876 | B2 | 9/2003 | Camp, Jr. | |
| 6,731,908 | B2 | 5/2004 | Berliner | |
| 6,745,009 | B2 | 6/2004 | Raghothaman | |
| 6,864,852 | B2 | 3/2005 | Chiang et al. | |
| 6,870,515 | B2 | 3/2005 | Kitchener | |
| 6,917,597 | B1 | 7/2005 | Schmidl | |
| 7,002,518 | B2 | 2/2006 | Lin | |
| 7,065,036 | B1 | 6/2006 | Ryan | |
| 7,091,894 | B2 | 8/2006 | Fudge | |
| 7,096,042 | B2 | 8/2006 | Marinier | |
| 7,184,466 | B1 | 2/2007 | Seemann | |
| 7,187,907 | B2 | 3/2007 | Widrow | |
| 7,221,688 | B2 | 5/2007 | Vanness | |
| 7,263,143 | B1 | 8/2007 | Rothaar | |
| 7,272,366 | B2 | 9/2007 | Haapoja | |
| 7,286,096 | B2 | 10/2007 | Jaffer | |
| 7,321,611 | B2 | 1/2008 | Fullerton | |
| 7,346,100 | B2 | 3/2008 | Kumar | |
| 7,471,204 | B2 | 12/2008 | Safarian | |
| 7,482,058 | B2 | 1/2009 | Ahmed | |
| 7,522,115 | B2 * | 4/2009 | Waltman | H01Q 19/132 343/776 |
| 7,627,325 | B2 | 12/2009 | McCoy | |
| 7,693,174 | B2 | 4/2010 | Ishibashi | |
| 7,706,744 | B2 | 4/2010 | Rodgers | |
| 7,817,641 | B1 | 10/2010 | Khandani | |
| 7,920,539 | B2 | 4/2011 | Stanford | |
| 7,944,871 | B2 | 5/2011 | Imamura | |
| 7,991,160 | B2 | 8/2011 | Guccione | |
| 8,023,438 | B2 | 9/2011 | Kangasmaa | |
| 8,031,744 | B2 | 10/2011 | Radunovic | |
| 8,064,502 | B2 | 11/2011 | Sawai | |
| 8,107,906 | B2 | 1/2012 | Lum | |
| 8,175,535 | B2 | 5/2012 | Mu | |
| 8,184,061 | B2 | 5/2012 | Sanford | |
| 8,208,628 | B2 | 6/2012 | Yener | |
| 8,238,551 | B2 | 8/2012 | Reznik | |
| 8,280,046 | B2 | 10/2012 | Rudolf | |
| 8,306,480 | B2 | 11/2012 | Muhammad | |
| 8,351,874 | B2 | 1/2013 | Dent | |
| 8,373,582 | B2 | 2/2013 | Hoffberg | |
| 8,385,235 | B2 | 2/2013 | Chiu | |
| 8,401,196 | B2 | 3/2013 | Goldberg | |
| 8,405,543 | B2 | 3/2013 | Kluge | |
| 8,498,585 | B2 | 7/2013 | Vandenameele | |
| 8,587,492 | B2 | 11/2013 | Runyon | |
| 8,628,650 | B2 | 1/2014 | Ah | |
| 8,629,650 | B2 | 1/2014 | Mohammadian | |
| 8,644,768 | B2 | 2/2014 | Kluge | |
| 8,744,377 | B2 | 6/2014 | Rimini | |
| 8,767,869 | B2 | 7/2014 | Rimini | |
| 8,823,577 | B2 | 9/2014 | Smid | |
| 8,836,581 | B2 | 9/2014 | Nysen | |
| 8,836,601 | B2 | 9/2014 | Sanford | |
| 8,836,606 | B2 | 9/2014 | Kish | |
| 8,837,615 | B2 | 9/2014 | Baldemair | |
| 8,842,044 | B2 | 9/2014 | Nysen | |
| 8,860,629 | B2 | 10/2014 | Shtrom | |
| 8,897,269 | B2 | 11/2014 | Ji | |
| 8,918,692 | B2 | 12/2014 | Braithwaite | |
| 8,976,641 | B2 | 3/2015 | Choi | |
| 9,019,165 | B2 | 4/2015 | Shtrom | |
| 9,036,749 | B2 | 5/2015 | Choi | |
| 9,054,795 | B2 | 6/2015 | Choi | |
| 9,059,879 | B2 | 6/2015 | Jaeger | |
| 9,071,313 | B2 | 6/2015 | Monsen | |
| 9,077,071 | B2 | 7/2015 | Shtrom | |
| 9,077,407 | B2 | 7/2015 | Koren | |
| 9,077,421 | B1 | 7/2015 | Mehlman | |
| 9,093,758 | B2 | 7/2015 | Kish | |
| 9,130,693 | B2 | 9/2015 | Reznik | |
| 9,246,234 | B2 * | 1/2016 | Rao | H01Q 19/193 |
| 9,276,682 | B2 | 3/2016 | Bharadia | |
| 9,277,591 | B2 | 3/2016 | Amini | |
| 9,281,979 | B2 | 3/2016 | Maltsev | |
| 9,337,885 | B2 | 5/2016 | Mehlman | |
| 9,571,205 | B1 | 2/2017 | Suarez | |
| 9,608,705 | B2 | 3/2017 | Maru | |
| 9,622,098 | B2 | 4/2017 | Emmanuel | |
| 9,713,010 | B2 | 7/2017 | Khandani | |
| 2001/0010495 | A1 | 8/2001 | Helms | |
| 2002/0032004 | A1 | 3/2002 | Widrow | |
| 2002/0097810 | A1 | 7/2002 | Seki | |
| 2003/0114128 | A1 | 6/2003 | Haapoja | |
| 2003/0189974 | A1 | 10/2003 | Ferry | |
| 2003/0189975 | A1 | 10/2003 | Fullerton | |
| 2004/0022229 | A1 | 2/2004 | Vanness | |
| 2004/0132414 | A1 | 7/2004 | Sendyk | |
| 2005/0020771 | A1 | 1/2005 | Ahmed | |
| 2005/0052330 | A1 | 3/2005 | Mehltretter | |
| 2005/0057420 | A1 | 3/2005 | Lin | |
| 2005/0083863 | A1 | 4/2005 | Umei | |

(56) References Cited

U.S. PATENT DOCUMENTS

| | | |
|---|---|---|
| 2005/0275576 A1 | 12/2005 | Fudge |
| 2006/0045063 A1 | 3/2006 | Stanford |
| 2006/0109067 A1 | 5/2006 | Shtrom |
| 2006/0192720 A1 | 8/2006 | Shtrom |
| 2007/0026804 A1 | 2/2007 | Ishibashi |
| 2007/0026807 A1 | 2/2007 | Kish |
| 2007/0036353 A1 | 2/2007 | Reznik |
| 2007/0057860 A1 | 3/2007 | Jaffer |
| 2007/0063875 A1 | 3/2007 | Hoffberg |
| 2007/0080891 A1 | 4/2007 | De Lustrac |
| 2007/0082617 A1 | 4/2007 | McCallister |
| 2007/0132651 A1 | 6/2007 | Nilsson |
| 2007/0254692 A1 | 11/2007 | McCoy |
| 2008/0009257 A1 | 1/2008 | Safarian |
| 2008/0063113 A1 | 3/2008 | Gao |
| 2008/0107046 A1 | 5/2008 | Kangasmaa |
| 2008/0123851 A1 | 5/2008 | Guccione |
| 2008/0129640 A1 | 6/2008 | Shtrom |
| 2008/0233966 A1 | 9/2008 | Scheim |
| 2009/0092072 A1 | 4/2009 | Imamura |
| 2009/0141900 A1 | 6/2009 | Ye |
| 2009/0186582 A1 | 7/2009 | Muhammad |
| 2009/0213770 A1 | 8/2009 | Mu |
| 2009/0253385 A1 | 10/2009 | Dent |
| 2009/0284218 A1 | 11/2009 | Mohammadian |
| 2010/0003931 A1 | 1/2010 | Krishnan |
| 2010/0008406 A1 | 1/2010 | Sawai |
| 2010/0020771 A1 | 1/2010 | Ji |
| 2010/0022201 A1 | 1/2010 | Vandenameele |
| 2010/0086012 A1 | 4/2010 | Rofougaran |
| 2010/0165866 A1 | 7/2010 | Sachse |
| 2010/0165895 A1 | 7/2010 | Elahi |
| 2010/0167662 A1 | 7/2010 | Kluge |
| 2010/0232324 A1 | 9/2010 | Radunovic |
| 2010/0248714 A1 | 9/2010 | Kang |
| 2010/0271987 A1 | 10/2010 | Chiu |
| 2010/0321245 A1 | 12/2010 | Aoki |
| 2011/0110451 A1 | 5/2011 | Tsai |
| 2011/0143655 A1 | 6/2011 | Ahn |
| 2011/0149714 A1 | 6/2011 | Rimini |
| 2011/0268100 A1 | 11/2011 | Gorokhov |
| 2012/0027113 A1 | 2/2012 | Gaal |
| 2012/0068904 A1 | 3/2012 | Shtrom |
| 2012/0087424 A1 | 4/2012 | Brown |
| 2012/0159279 A1 | 6/2012 | Braithwaite |
| 2012/0200158 A1 | 8/2012 | Takei |
| 2012/0201153 A1 | 8/2012 | Bharadia |
| 2012/0201173 A1 | 8/2012 | Jain |
| 2012/0220246 A1 | 8/2012 | Kushnir |
| 2012/0281834 A1 | 11/2012 | Reznik |
| 2012/0300680 A1 | 11/2012 | Pietsch |
| 2013/0010851 A1 | 1/2013 | Jaeger |
| 2013/0044791 A1 | 2/2013 | Rimini |
| 2013/0089009 A1 | 4/2013 | Li |
| 2013/0099974 A1 | 4/2013 | Wang |
| 2013/0102254 A1 | 4/2013 | Cyzs |
| 2013/0114468 A1 | 5/2013 | Hui |
| 2013/0286903 A1 | 10/2013 | Khojastepour |
| 2013/0301487 A1 | 11/2013 | Khandani |
| 2014/0126675 A1 | 5/2014 | Monsen |
| 2014/0135056 A1 | 5/2014 | Wang |
| 2014/0169236 A1 | 6/2014 | Choi |
| 2014/0204808 A1 | 7/2014 | Choi |
| 2014/0210681 A1 | 7/2014 | Shtrom |
| 2014/0218248 A1 | 8/2014 | Schulz |
| 2014/0219139 A1 | 8/2014 | Choi |
| 2014/0225788 A1 | 8/2014 | Schulz |
| 2014/0334322 A1 | 11/2014 | Shtrom |
| 2014/0348032 A1 | 11/2014 | Hua |
| 2015/0029906 A1 | 1/2015 | Jana |
| 2015/0043323 A1 | 2/2015 | Choi |
| 2015/0043685 A1 | 2/2015 | Choi |
| 2015/0049834 A1 | 2/2015 | Choi |
| 2015/0063176 A1 | 3/2015 | Hong |
| 2015/0070243 A1 | 3/2015 | Kish |
| 2015/0078217 A1 | 3/2015 | Choi |
| 2015/0139284 A1 | 5/2015 | Choi |
| 2015/0171903 A1 | 6/2015 | Mehlman |
| 2015/0188646 A1 | 7/2015 | Bharadia |
| 2015/0223173 A1 | 8/2015 | Khojastepour |
| 2015/0236750 A1 | 8/2015 | Choi |
| 2015/0249997 A1 | 9/2015 | Clegg |
| 2015/0263780 A1 | 9/2015 | Mehlman |
| 2015/0280893 A1 | 10/2015 | Choi |
| 2015/0311599 A1 | 10/2015 | Shtrom |
| 2015/0318976 A1 | 11/2015 | Eltawil |
| 2015/0333847 A1 | 11/2015 | Bharadia |
| 2015/0334745 A1 | 11/2015 | Zhao |
| 2015/0341125 A1 | 11/2015 | Bharadia |
| 2015/0341879 A1 | 11/2015 | Shtrom |
| 2016/0127876 A1 | 5/2016 | Kish |
| 2016/0226653 A1 | 8/2016 | Bharadia |
| 2016/0248160 A1 | 8/2016 | Shtrom |
| 2016/0249376 A1 | 8/2016 | Kish |

FOREIGN PATENT DOCUMENTS

| | | |
|---|---|---|
| JP | 10502220 A | 2/1998 |
| KR | 1020040096404 | 11/2004 |
| KR | 1020070072629 | 7/2007 |
| KR | 1020120080231 | 7/2012 |
| WO | 1994028585 | 12/1994 |
| WO | 1996022643 | 7/1996 |
| WO | 2011065020 | 6/2002 |
| WO | 2003098823 | 11/2003 |
| WO | 2004007497 | 1/2004 |
| WO | WO2009156510 | 12/2009 |
| WO | 2010005951 | 1/2010 |
| WO | 2010051232 | 5/2010 |
| WO | 2011148341 | 12/2011 |
| WO | 2012042256 | 4/2012 |
| WO | 2016014016 | 1/2016 |

OTHER PUBLICATIONS

EP Extended European Search Report for EP App. No. 13790076.7, dated Mar. 2, 2016, 8 pages.

EP Extended Search Report for EP App. No. 13790160.9-1874, dated Jan. 16, 2016, 9 pages.

Extended European Search Report for EP App. 13790948.7, dated Nov. 4, 2015, 9 pages.

Gharavol, E., et al., "Robust Joint Optimization of MIMO Two-Way Relay Channels With Imperfect CSI", Communication, Control, and Computing (Allerton), 2011 49th Annual Allerton Conference on, IEEE, Sep. 28, 2011, pp. 1657-1664, XP032085749, DOI: 10.1109/ALLERTON.2011.6120368, ISBN: 978-1-4577-1817-5.

International Search Report and Written Opinion for PCT/US2013/040822 dated Jul. 18, 2013.

International Search Report and Written Opinion for PCT/US2014/042136 dated Dec. 9, 2014.

International Search Report and Written Opinion for PCT/US2014/051137 dated Nov. 24, 2014.

International Search Report and Written Opinion from PCT/US2014/050968 dated Nov. 19, 2014.

International Search Report for PCT/US2013/040818 dated Jul. 24, 2013.

Jain, M., "Practical, Real-Time, Full Duplex Wireless", MobiCom '11, Sep. 19-23, 2011, Las Vegans, NC, USA, 2011, 12 pages.

Jung II, ., "Achieving single channel, full duplex wireless communication", Proceedings from the Annual International Conference on Mobile Computing and Networking, MOBICOM—MOBICOM' 10 and MOBIHOC' 10—Proceedings of the 16th Annual International Conference on Mobile Computing and Networking and 11th ACM International Symposi, Sep. 20, 2010, pp. 1-12, XP002696691.

McMichael, J. G., et al., "Optimal tuning of analog self-interference cancellers for full-duplex wireless communication". IEEE, Fiftieth Annual Allerton Conference, Oct. 1-5, 2012, p. 246-251.

Persson, D., et al., "Joint Source-Channel Coding for the MIMO Broadcast Channel", IEEE Transactions on Signal Processing, vol. 60, No. 4, Apr. 2012, pp. 2085-2090.

(56) References Cited

OTHER PUBLICATIONS

Provisional Application, entitled: "Adaptive Non-Linear Digital Cancellation for Full-Duplex Radios", U.S. Appl. No. 61/864,453, filed Aug. 9, 2013.
Provisional Application, entitled: "Cancellation Circuit With Variable Delay and Amplifier", U.S. Appl. No. 61/876,663, filed Sep. 11, 2013.
Provisional Application, entitled: "Feed Foward Signal Cancellation", U.S. Appl. No. 61/736,726, filed Dec. 13, 2012.
Provisional Application, entitled: "Frequency Independent Analog Cancellation Circuit", U.S. Appl. No. 61/864,459, filed Aug. 9, 2013.
Provisional Application, entitled: "Hybrid IF/RF Digital Cancellation Architectures for Full-Duplex Radios", U.S. Appl. No. 61/915,431, filed Dec. 12, 2013.
Provisional Application, entitled: "Interference Cancellation Architectures With Frequency Isolation", U.S. Appl. No. 62/030,240, filed Jul. 29, 2014.
Provisional Application, entitled: "Method and Apparatus for Mitigating Phase Noise to Improve Self-Interference Cancellation", U.S. Appl. No. 61/865,943, filed Aug. 14, 2013.
Provisional Application, entitled: "Near Band Cancellation", U.S. Appl. No. 61/970,852, filed Mar. 26, 2014.
Vaze, R., et al., "To Code or Not to Code in Multi-Hop Relay Channels", arxiv.org, Cornell University Library, May 20, 2008, XP080418936, 30 pages.
Provisional Application, entitled: "Signal Cancellation Using Feedforward and Feedback", U.S. Appl. No. 61/760,518, filed Feb. 4, 2013.
Provisional Application, entitled: "Self Interference Cancellation Architecture for In-Band Full Duplex Relay Node", U.S. Appl. No. 61/871,519, filed Aug. 29, 2013.
Provisional Application, entitled: "Techniques for Digital Interference Cancellation", U.S. Appl. No. 62/002,578, filed May 23, 2014.
Provisional Application, entitled: "Tunable Self Interference Cancellation", U.S. Appl. No. 61/950,742, filed Mar. 10, 2014.
Provisional Application, entitled: "Tuning Algorithm for Multi-Tap Signal Cancellation Circuit", U.S. Appl. No. 61/754,447, filed Jan. 18, 2013.
Korean Patent Abstract of 1020070072629, dated Jul. 4, 2007, 1 page.
Extended European Search Report for EP App. 14865287.8, dated Jul. 4, 2017. 7 Pages.
Aono T et al: "Wireless secret key generation exploiting reactance-domain scalar response of multipath fading channels", IEEE Transactions on Antennas and Propagation, IEEE Service Center, Piscataway, NJ, US, vol. 53, No. 11, Nov. 1, 2005 (Nov. 1, 2005), pp. 3776-3784, XP001512766, ISSN: 0018-926X, DOI: 10.1109/TAP.2005.858853.
Khandani Amir K: "Two-way (true full-duplex) wireless", 2013 13th Canadian Workshop on Information Theory, IEEE, Jun. 18, 2013 (Jun. 18, 2013), pp. 33-38, XP032495648, DOI: 10.1109/CWIT.2013.6621588 , [retrieved on Oct. 4, 2013].

* cited by examiner

PRIMARY CHANNEL

AUXILARY CHANNEL

SYSTEMS AND METHODS OF ANTENNA DESIGN FOR FULL-DUPLEX LINE OF SIGHT TRANSMISSION

CROSS-REFERENCE TO RELATED APPLICATIONS

This application is a non-provisional filing of, and claims benefit under 35 U.S.C. § 119(e) from, U.S. Provisional Patent Application Ser. No. 62/330,687, entitled "Antenna/Dish Design for Full-duplex Line of Sight Transmission," filed May 2, 2016, the entirety of which is incorporated herein by reference.

BACKGROUND

Antennas with high directional gains are widely used to improve power efficiency in line of sight wireless transmission. As a wireless signal propagates, regardless of the pattern of the transmit antenna, the propagating wave will gradually tend to a planar wave. In line of sight transmissions using directional antennas, only two polarizations may be used to provide two spatial channels. This results in a 2×2 Multiple-Input Multiple-Output (MIMO) channel. Typically, the two spatial dimensions correspond to horizontal and vertical linear polarizations, or correspond to left-handed and right-handed circular polarizations. In such systems, dual-polarized antennas are widely used. Further, in such line-of-sight transmission setups, it is desirable to have a non-singular channel matrix supporting more than two dimensions.

The number of spatial channels can be increased beyond two, at the cost of using multiple (separate) transmit and multiple (separate) receive antennas, with restrictions on spacing among transmit and/or among receive antennas. In such setups, as the receive antennas detect a plane wave, the channel matrix in the underlying MIMO system may be close to singular. Alternatively, non-line-of-sight MIMO structures may realize additional spatial dimensions without such severe restrictions on their spacing due to the effect of multi-path fading. The reason is that, in conventional MIMO systems (non-line-of-sight), the channel matrix is composed of (independent) complex random numbers, and consequently, the channel matrix will be (with high probability) non-singular. In prior art, to provide a non-singular channel matrix supporting more than two spatial dimensions in line-of-sight transmission setups, it is required to have a large spacing among dual-polarized transmit antennas and a large spacing among dual-polarized receive antennas. Thus it may be desirable to increase the number of spatial dimensions in line-of-sight wireless links without such severe restrictions on antenna spacing.

SUMMARY

Embodiments described herein include methods for providing a 2×2 full-duplex line-of-sight (LoS) transmission scheme, supporting two simultaneous spatial dimensions in each direction without severe restrictions on size and spacing of an antenna.

Described herein are methods and apparatuses for communicating primary signals over a high-speed primary channel, the primary signals having a beam pattern having a full lobe at a center of an axis of propagation and communicating auxiliary signals over a low-speed auxiliary channel, the auxiliary signals having a decoupled beam pattern having a null at the center of axis of propagation, the high-speed primary channel and low-speed auxiliary channel operating in full duplex.

BRIEF DESCRIPTION OF THE DRAWINGS

A more detailed understanding may be had from the following description, presented by way of example in conjunction with the accompanying drawings, wherein.

DETAILED DESCRIPTION

A detailed description of illustrative embodiments will now be provided with reference to the various Figures. Although this description provides detailed examples of possible implementations, it should be noted that the provided details are intended to be by way of example and in no way limit the scope of the application.

Present embodiments focusing on line-of-sight (LoS) transmission disclose antenna design methods in conjunction with methods for cancellation of residual self-interference to establish a dual-polarized wireless channel in each direction, while relaxing the restrictions on the spacing among transmit elements, and spacing among receive elements. Such embodiments may include a 2×2 Full-Duplex (FD) line-of-sight MIMO system.

Figure 1:
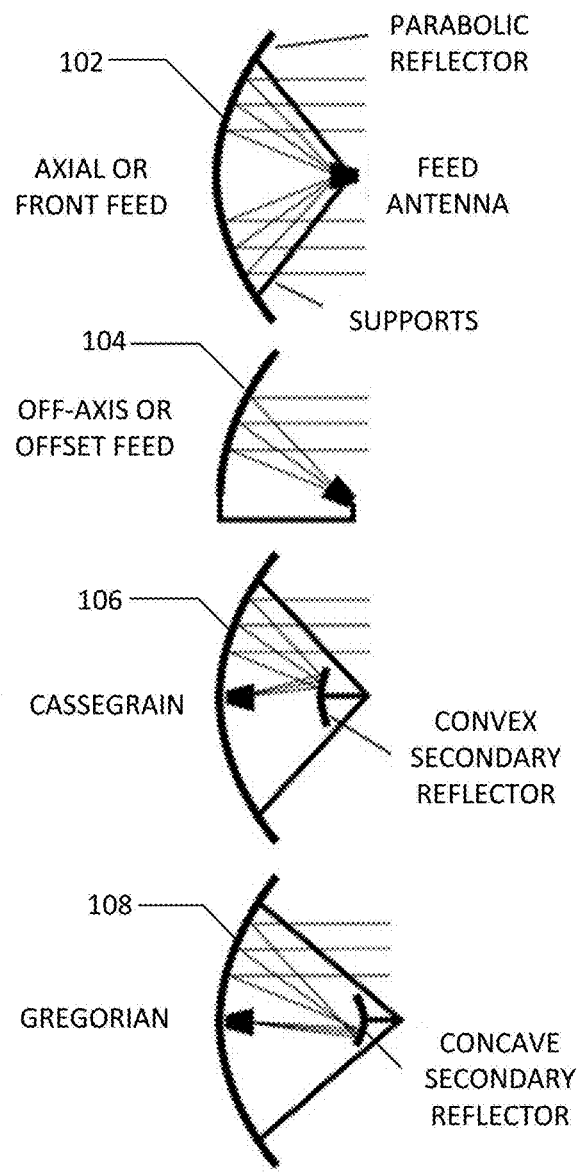
FIG. 1 depicts exemplary excitations of a parabolic dish antenna, in accordance with some embodiments.

Many directional antennas include a dish structure with a dual-polarized wave emanating from a focal point of the dish. FIG. 1 illustrates four techniques for the placement of a dual-polarized Radio-Frequency (RF) signal at the focal point of a dish. As shown, the four techniques shown in FIG. 1 include Axial (front feed) placement 102, off-axis (offset feed) placement 104, Cassegrain placement 106, and Gregorian placement 108.

In many cases, a second dual-polarized directional antenna is used as a receiver at the other end of the transmission system. In legacy systems, a pair of dual-polarized antennas are used at both ends of the link. Herein for descriptive purposes, the two ends of the link are denoted by A and B. To provide connectivity in both directions, i.e, A-to-B and B-to-A, legacy systems rely on either Time-Division-Duplex (TDD) or Frequency-Division-Duplex (FDD). Embodiments described herein disclose methods for spatial multiplexing of the two channels, i.e., that of A-to-B and B-to-A. In such embodiments, the two channels are concurrent and occupy the same frequency band. One problem encountered in spatial multiplexing of channels is that an excessive amount self-interference may be present. Such self-interference may include interference from a transmitter to its own receiver.

At least one configuration of a directional 2×2 MIMO system, i.e., channels A-to-B and B-to-A, is based on using circular polarization. In such a configuration, left-handed and right-handed circular polarizations are used instead of the vertical and horizontal polarizations.

Self-interference of spatial division duplexing of channels A-to-B and B-to-A may be simplified if the two channels support different data rates. Consider the following two states:

State 1: Channel A-to-B (acting as the primary channel) has a higher data rate with respect to the channel B-to-A (acting as the auxiliary channel).

State 2: Channel B-to-A (acting as the primary channel) has a higher data rate with respect to the channel A-to-B (acting as the auxiliary channel).

Described embodiments further include the possibility of alternating between the above two states, depending on the amount of data in each direction. In at least one embodiment, the above two states reduce to:

State 3: Channel A-to-B (dual polarized, primary channel) carries the main traffic, while channel B-to-A (dual polarized, auxiliary channel) carries control signals, such as signals used for training, frequency/clock synchronization and request for retransmission.

State 4: Channel B-to-A (dual polarized, primary channel) carries the main traffic, while channel A-to-B (dual polarized, auxiliary channel) carries control signals, such as signals used for training, frequency/clock synchronization and request for retransmission.

In another embodiment, the above two states further reduce to single polarization in the auxiliary channel:

State 5: Channel A-to-B (dual polarized, primary channel) carries the main traffic, while channel B-to-A (single polarized, auxiliary channel) carries control signals, such as signals used for training, frequency/clock synchronization and request for retransmission.

State 6: Channel B-to-A (dual polarized, primary channel) carries the main traffic, while channel A-to-B (single polarized, auxiliary channel) carries control signals, such as signals used for training, frequency/clock synchronization and request for retransmission.

Described embodiments support various configurations as summarized below:

Channel A-to-B uses dual linear polarization, and channel B-to-A uses dual linear polarization.

Channel A-to-B uses dual circular polarization, and channel B-to-A uses dual circular polarization.

Channel A-to-B uses dual circular polarization, and channel B-to-A uses dual linear polarization.

Channel A-to-B uses dual linear polarization, and channel B-to-A uses dual circular polarization.

Although described embodiments are explained in terms of configurations where at least one of the channels, namely A-to-B and/or B-to-A, is dual polarized, it should be noted that in some embodiments both channels rely on a single polarization.

One aspect of described embodiments is a method to reduce the amount of self-interference through design of an auxiliary antenna and its placement with respect to the primary antenna, which may include a dish for example. Below, methods are described as considering the primary channel to operate in a direction of A-to-B, while the auxiliary channel operates in a direction of B-to-A, and is thus full duplex operation. The primary channel may have a higher Signal-to-Noise-Ratio (SNR) with respect to the auxiliary channel, and thereby may carry more data.

Figure 2:
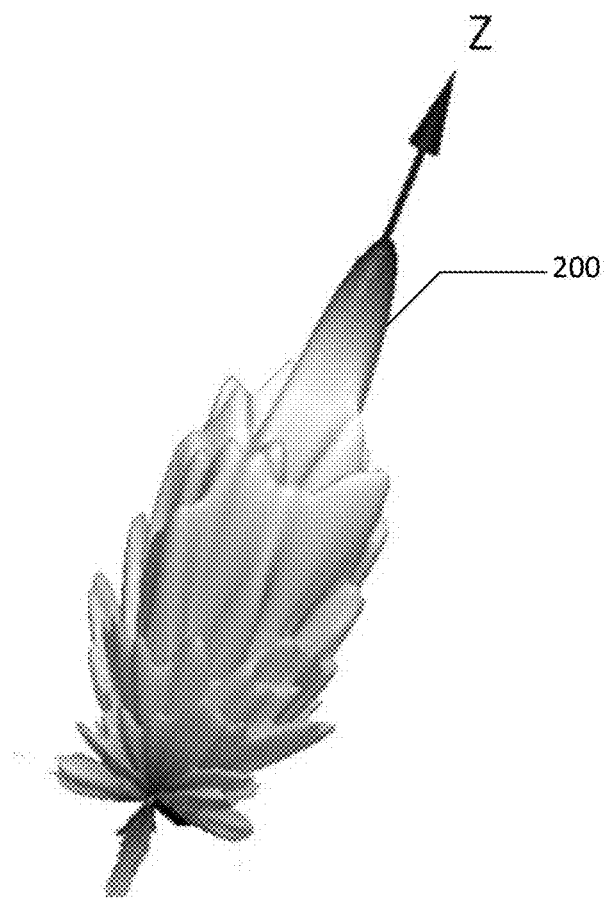
FIG. 2 depicts an exemplary shape of a primary channel beam, in accordance with some embodiments.
Figure 3:
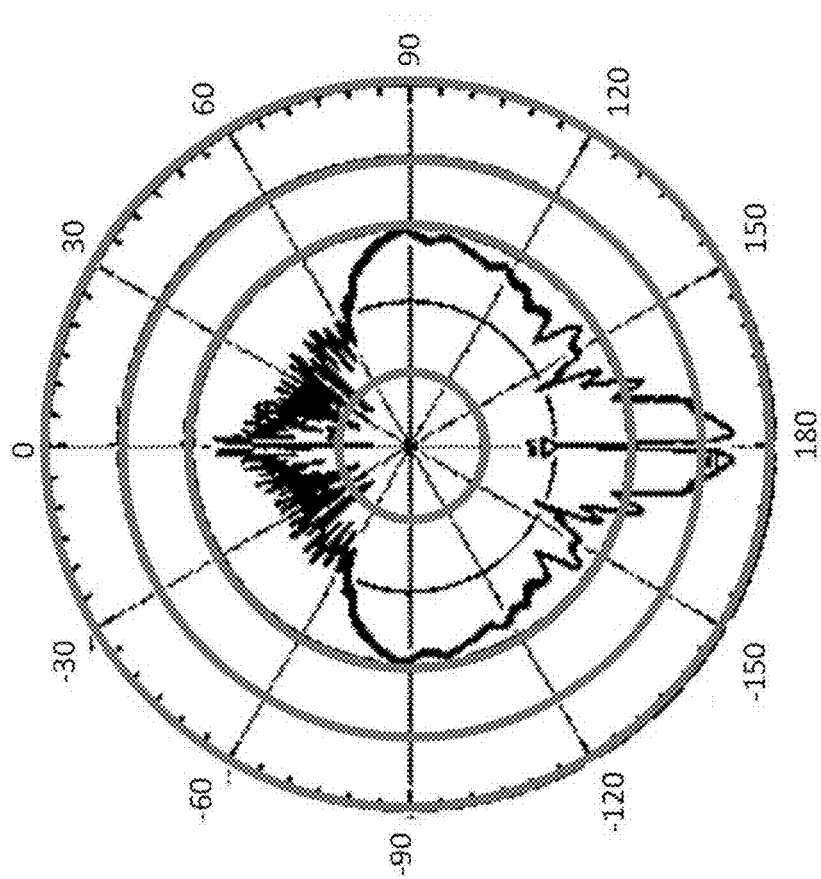
FIG. 3 depicts an exemplary shape of an auxiliary channel beam, in accordance with some embodiments.
Figure 3:
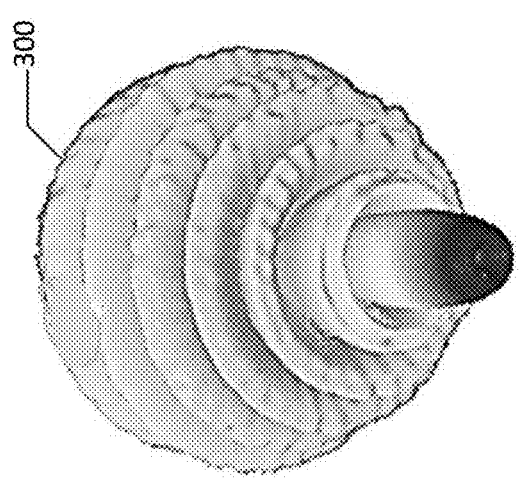
Figure 22:
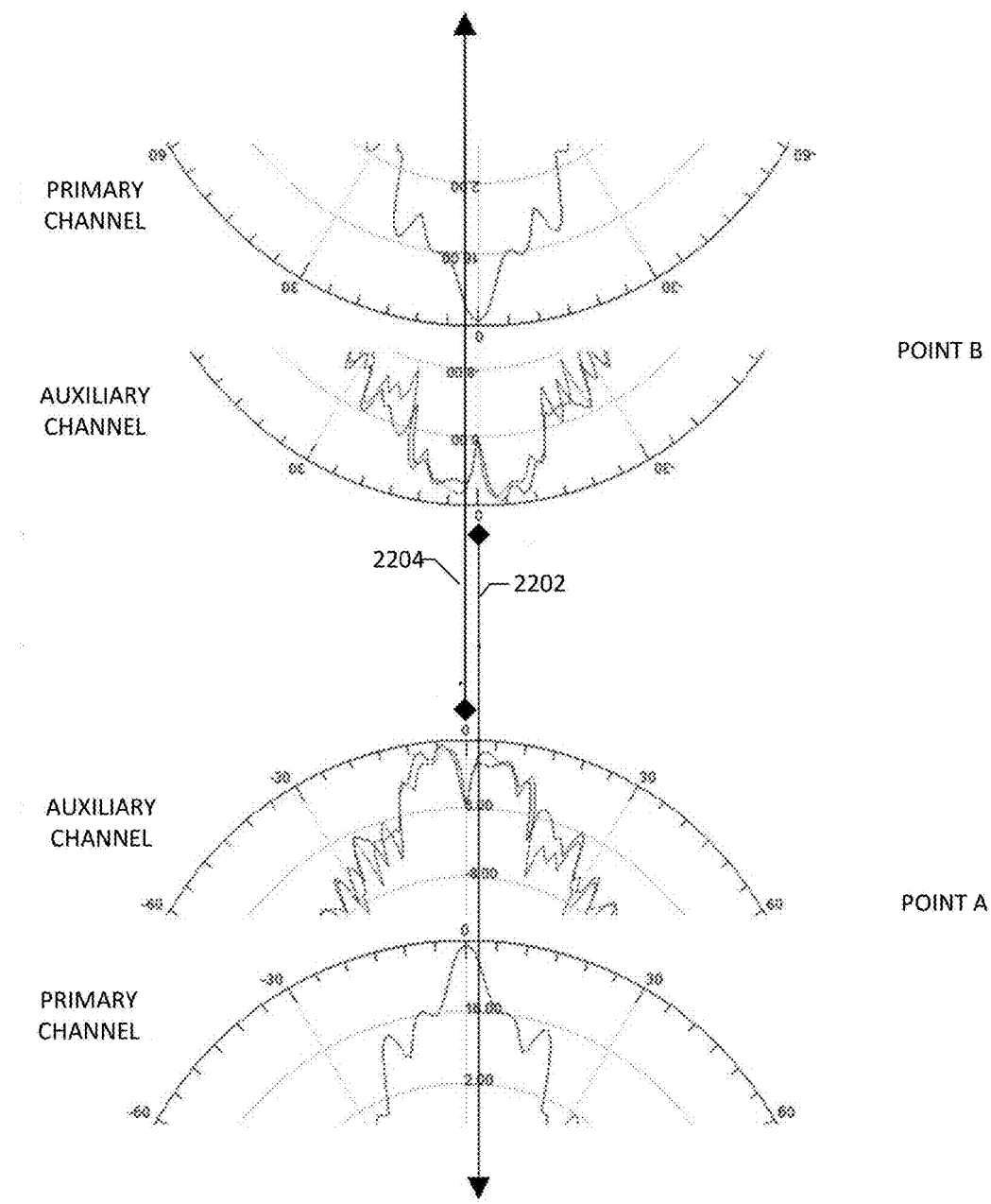
FIG. 22 depicts exemplary adjustment of alignment of the antennas structures at point A and point B (with respect to each other) to maximize the signal-to-noise ratios, in accordance with some embodiments.

In some embodiments, the antennas and reflectors are placed for the primary channel to have a beam pattern having a full main lobe, while the auxiliary channel has decoupled beam pattern having a null at the center of its axis of propagation. Examples of the beam pattern 200 of the primary channel having the full main lobe and the decoupled beam pattern 300 of the auxiliary channel having the null at the center of the axis of propagation are shown in FIGS. 2 and 3, respectively. At least one design objective in the described embodiments is to reduce the angle of the central null in the auxiliary decoupled beam pattern. As the primary channel has a full lobe at the center of the axis of propagation, the primary channel may function if the two ends of the channel, A and B, are perfectly aligned. However, as the decoupled beam pattern of the auxiliary channel has a null in the center, a small misalignment of the antennas at points A and B may be introduced so that the receiving end does not fall within the null of the corresponding transmitter. Such a misalignment is illustrated by FIG. 22, where the axis of symmetry for the point A antennas 2202 and the axis of symmetry for the point B antennas 2204 have misalignments of approximately 2 degrees. As shown in FIG. 22, the peak energy in the auxiliary beam occurs slightly off the main axis. The null in the beam of the auxiliary channel is a side-effect of the method used to decouple the primary and auxiliary antennas to reduce the self-interference through placement of the auxiliary antenna. Through such constructions of antenna beams, the antenna gain of the auxiliary channel is compromised to reduce self-interference.

Design objectives for embodiments herein are given below, in no particular order:

Maximize gain of the primary channel.
Maximize gain of the auxiliary channel.
Reduce width of the null in the auxiliary channel.
Reduce coupling and thereby self-interference.

Figure 4:
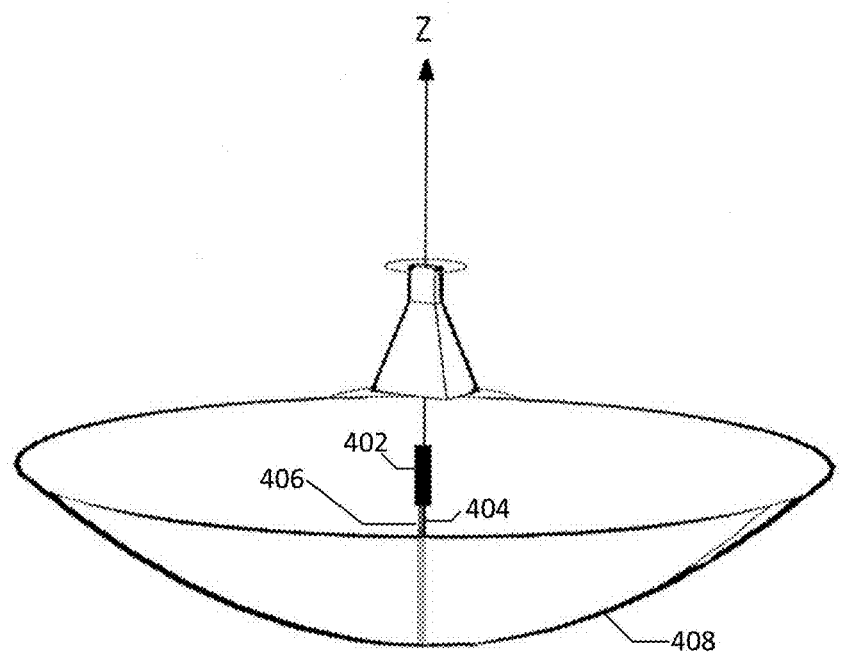
FIG. 4 depicts dual polarization in the primary channel and single polarization in the auxiliary channel, in accordance with some embodiments.

In some embodiments where the primary channel incorporates dual polarization and the auxiliary channel incorporates a single polarization, the primary channel is based on one of the conventional excitation techniques shown in FIG. 1, and the auxiliary channel uses an auxiliary antenna having a monopole or a dipole orthogonal to the interior of the dish placed along the axis of propagation. FIGS. 4-8 illustrate various possible configurations, in accordance with some embodiments. FIG. 4 illustrates dual polarization in the primary channel and single polarization in the auxiliary channel. As shown, the antenna includes an auxiliary antenna including monopole 402 and a monopole stand 406. In some embodiments, the monopole stand 406 includes a coaxial cable 404 with one wire connected to the body of the dish 408 (used as ground) of the primary antenna, and the other wire connecting the auxiliary RF signal to the monopole antenna 402. At least one embodiment relies on a monopole antenna with the dish structure acting as a ground plane.

Figure 5:
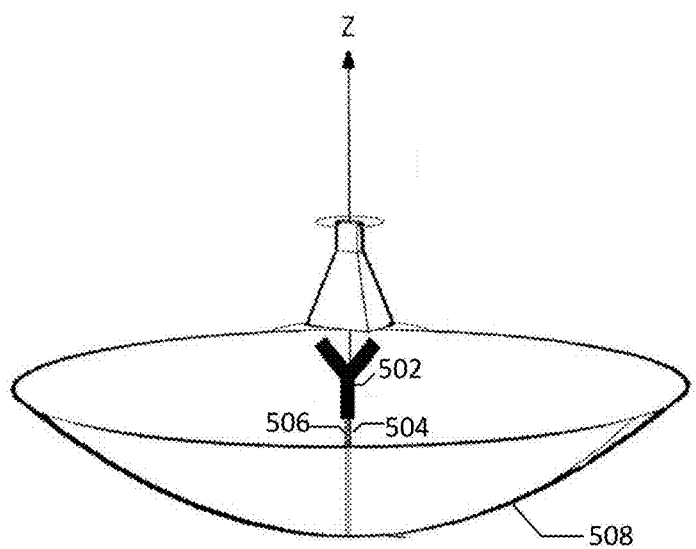
FIG. 5 depicts dual polarization in primary channel and single polarization in the auxiliary channel using a monopole with an arm shaped to improve design objectives, in accordance with some embodiments.
Figure 5:
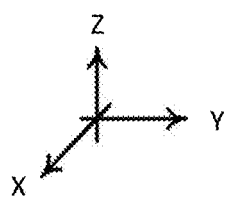

FIG. 5 illustrates dual polarization in the primary channel and single polarization in the auxiliary channel using an auxiliary antenna having a monopole with an arm shaped to improve design objectives, in accordance with some embodiments. As shown in FIG. 5, the auxiliary antenna includes a monopole 502 with a shaped arm. Similar to FIG. 4, a monopole stand 506 includes a coaxial cable 504 with a wire attached to the dish 508 for ground and the other end of the cable connecting the auxiliary RF signal to the monopole antenna 502. The shaping of the monopole 502 may be done to improve the design objectives listed above.

Figure 6:
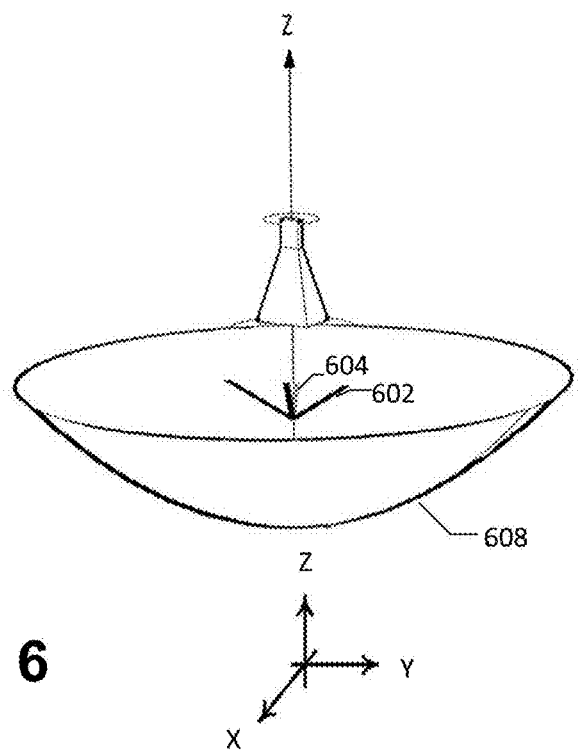
FIG. 6 depicts placement of antennas for dual polarization in the primary channel and dual polarization in the auxiliary channel using two monopoles with arms shaped to improve design objectives, in accordance with some embodiments.

FIG. 6 illustrates dual polarization in the primary channel and dual polarization in the auxiliary channel using two monopoles 602 and 604 having arms shaped to improve the design objectives described above. The auxiliary antenna shown in FIG. 6 may further include a single stand holding both monopoles 602 and 604 (not shown). The auxiliary antenna of FIG. 6 may include two coaxial cables (not shown), each having one end connected to the body of the dish 608 of the primary antenna as a ground plane, with the other end of each cable feeding an auxiliary RF signal to the corresponding bent-arm monopole antenna 602 or 604. As indicated by the XYZ axis, monopole 602 is in the YV plane supporting Y-polarization, while monopole 604 is in the XZ plane to support X-polarization.

Figure 7:
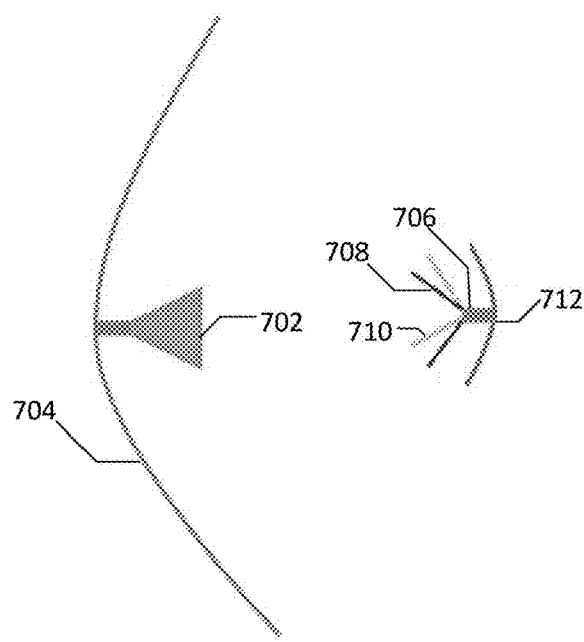
FIG. 7 depicts placement of antennas for dual polarization in the primary channel and dual polarization in the auxiliary channel using two monopoles with arms shaped to improve design objectives, where the axis of symmetry of monopoles is the same as the axis of symmetry of the entire structure.
Figure 8:
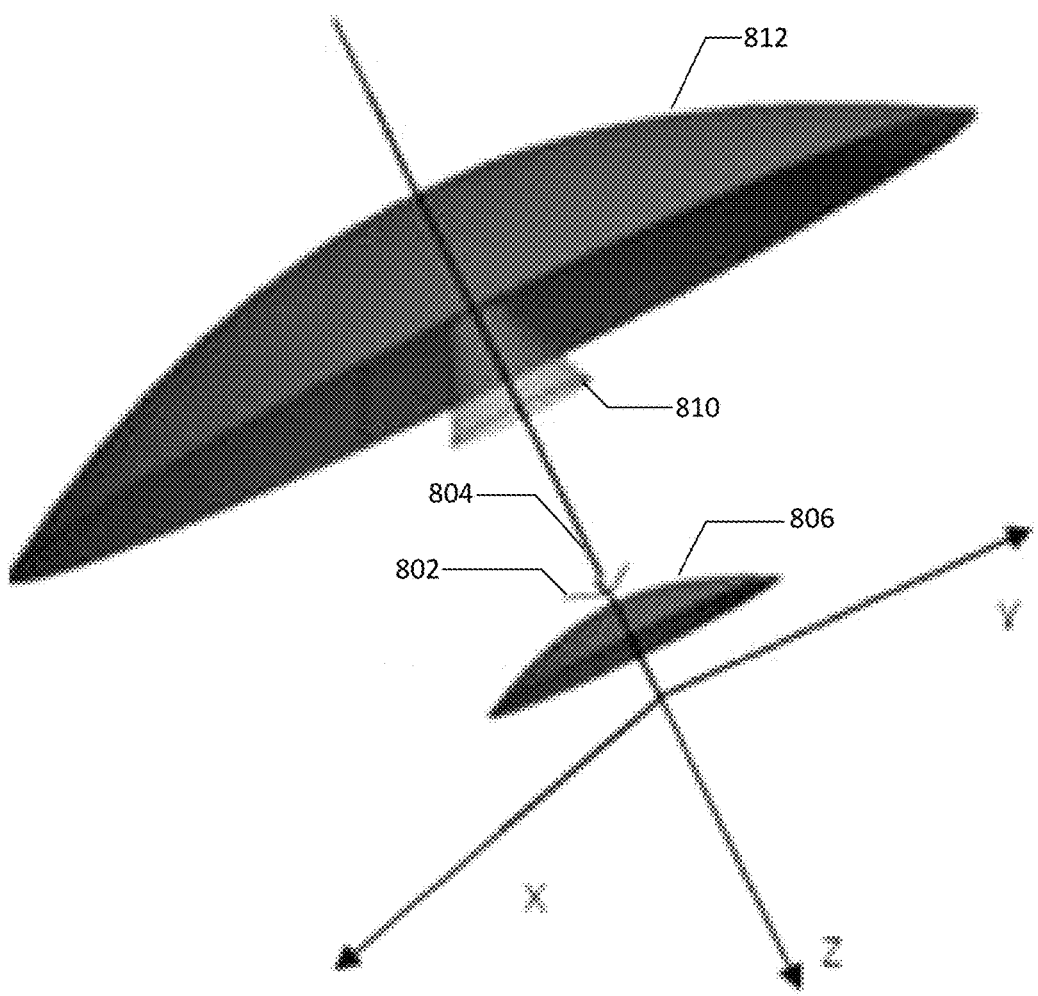
FIG. 8 depicts placement of antennas for dual polarization in the primary channel and dual polarization in the auxiliary channel, where the two polarizations in the auxiliary channel are obtained using two monopoles with arms shaped to improve the design objectives, in accordance with some embodiments.

FIG. 7 illustrates an excitation dual polarized horn 702 connected to the main dish 704 of the primary antenna, and a stand 706 holding dipoles 708 and 710 connected to a concave reflector 712. As shown, the dual polarized auxiliary link uses two monopoles with shaped arms. The axis of symmetry of the monopoles is the same as the axis of symmetry of the entire structure. FIG. 8 illustrates an auxiliary antenna having two monopoles 802 and 804 having v-shaped arms connected to a convex reflector 806, and a circular excitation horn 810 connected to the main dish 812, in accordance with some embodiments.

To further reduce coupling, small deviations from perfect placement caused by reflection of the signals incident on the dish and/or excitation waveguide may be compensated for. Such compensation may be achieved by:

Adjusting a shape of the dipole arms, angle between the two dipole arms, and curvature of the dipole arms.
Adjusting shape and curvature of the reflector.
Adjusting shape and curvature of the dish.

These degrees of freedom are adjusted accounting for all design criteria previously described.

Figure 9:
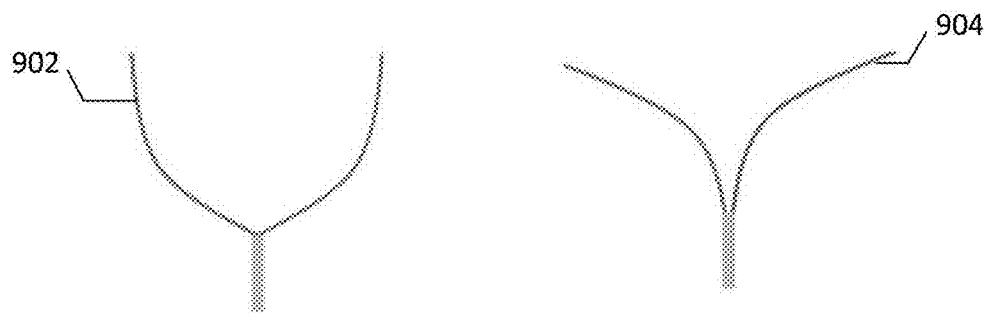
FIG. 9 depicts monopoles with arms shaped to improve the design objectives, in accordance with some embodiments.

FIG. 9 illustrates exemplary configurations 902 and 904 for the shape of dipole arms, in accordance with some embodiments. Another degree of freedom may include direction of the v-shaped arms, such as pointing the arms towards or away from the main dish of the primary antenna.

Figure 10:
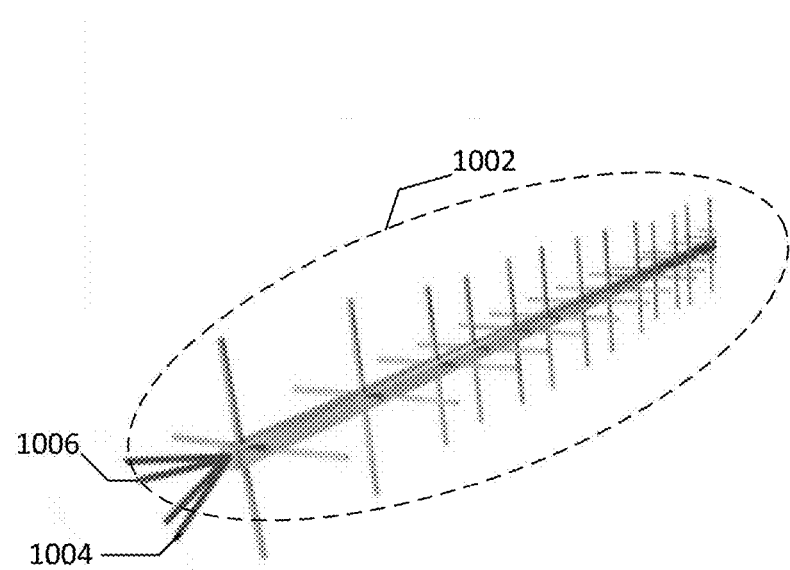
FIG. 10 depicts dual polarized Yagi antenna for the primary channel, and dual-polarized shaped dipole for the auxiliary channel, in accordance with some embodiments.

Embodiments above have been explained in the language of using a dish antenna as the primary antenna for beamforming. However, alternative embodiments may utilize other forms of directive antennas, such as Yagi or directional circular polarized antennas. An example for a primary antenna taking the form of a Yagi antenna 1002 is shown in FIG. 10 connected to an auxiliary antenna including two monopoles having shaped arms 1004 and 1006.

Figure 11:
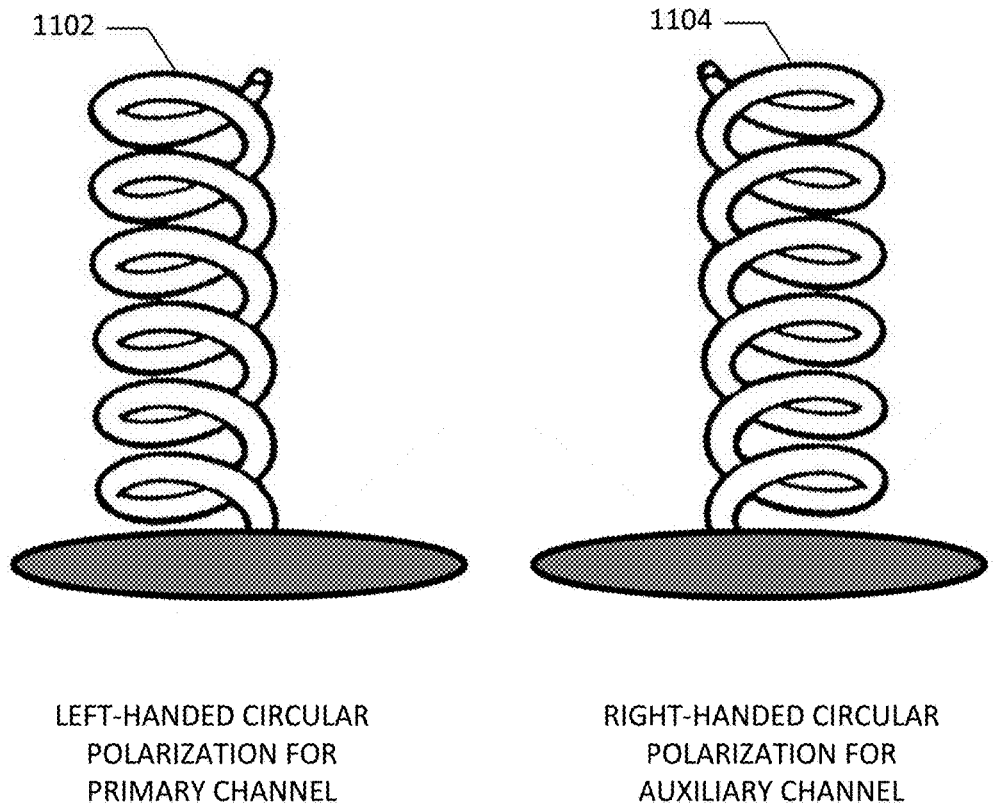
FIG. 11 depicts right-handed and left-handed circular polarization for a single polarized primary channel and single polarized auxiliary channels, in accordance with some embodiments.
Figure 12:
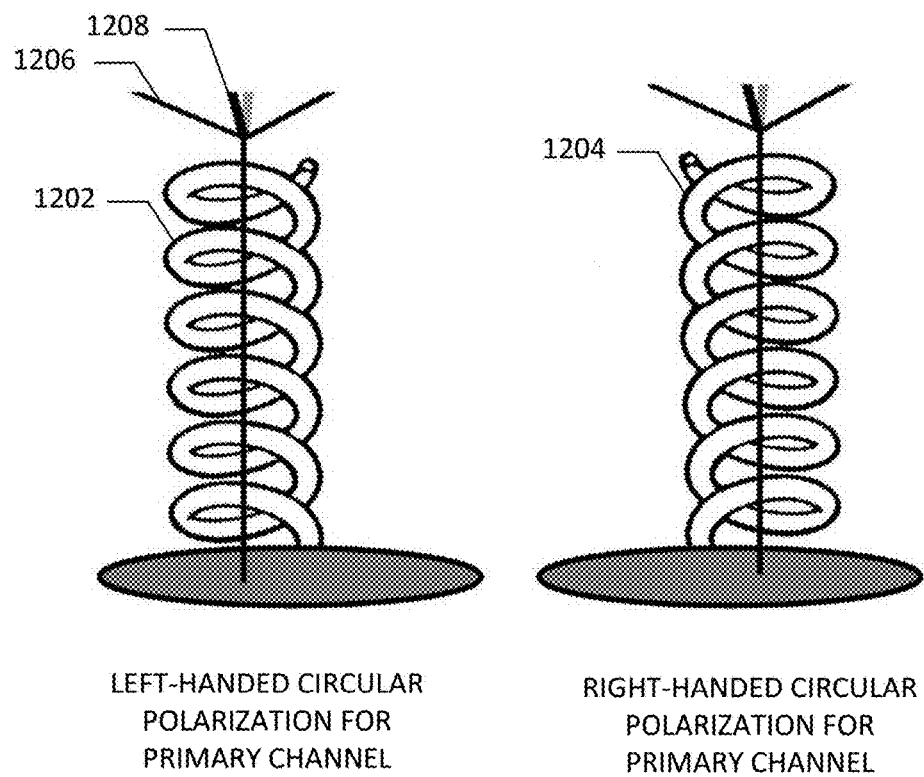
FIG. 12 depicts right-handed and left-handed circular polarization for dual-polarized primary channel, and monopoles with shaped arms for dual-polarized auxiliary channels, in accordance with some embodiments.

FIGS. 11 and 12 illustrate examples based on circular polarizations. As shown, FIG. 11 includes a left-hand circular polarization 1102 for the primary channel and a right-hand circular polarization 1104 for the auxiliary channel. In FIG. 12, the primary channel includes both left and right hand circular polarizations 1202 and 1204, and the auxiliary antenna includes two antennas 1206 and 1208 for dual-polarization of the auxiliary channel. In such a configuration, the corresponding signals of the auxiliary antenna may be combined to improve effective Signal-to noise-plus-Interference Ratio (SINR), or reduce the coupling/self-interference. Combination circuitry to perform such a combination may be static or adaptive, using dynamic adjustments.

Figure 13:
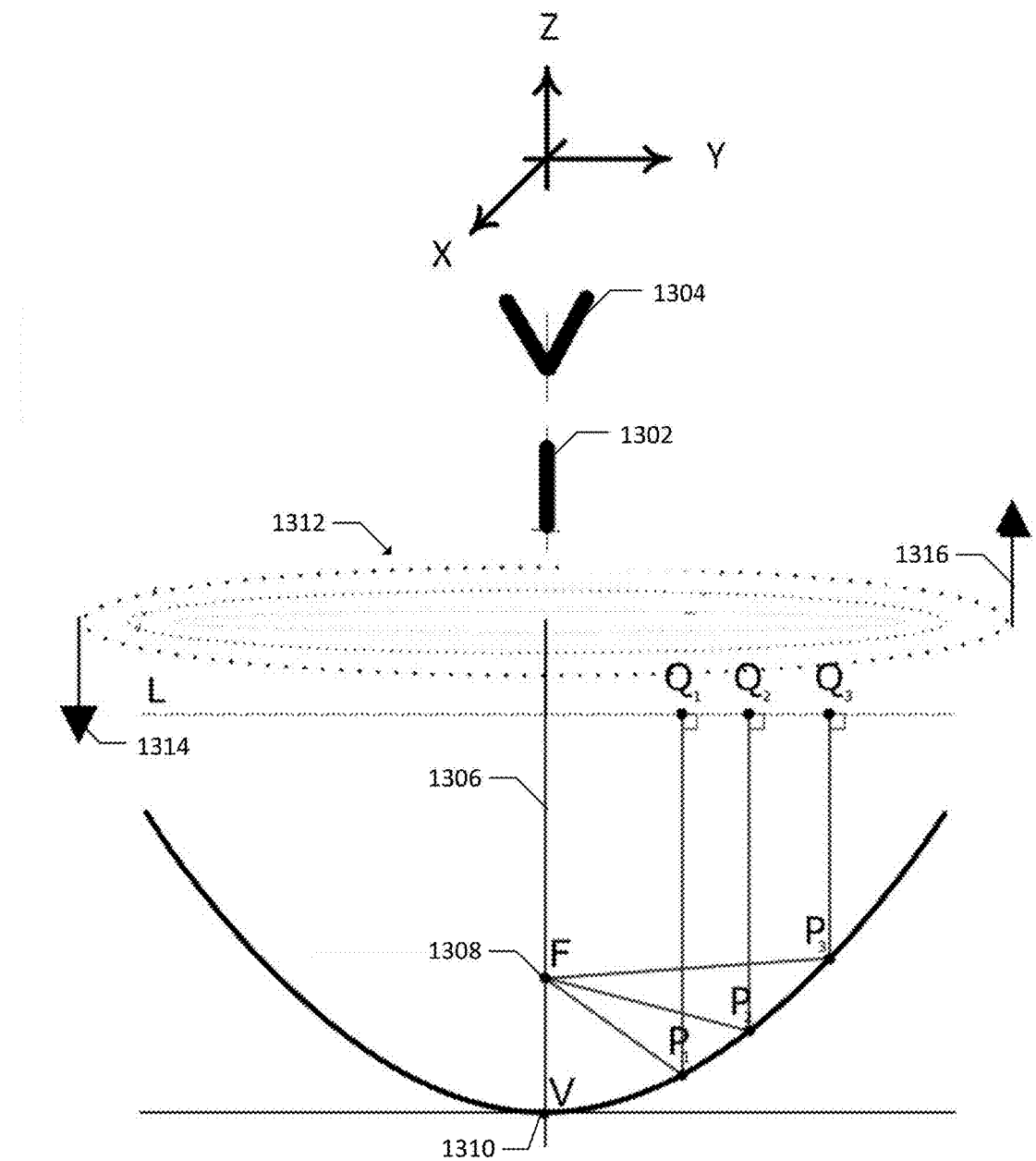
FIG. 13 depicts symmetries that are responsible for reduction in coupling, in accordance with some embodiments.

FIG. 13 illustrates an embodiment in which the primary channel includes a parabolic dish and the auxiliary channel includes a monopole or a dipole antenna. As shown in FIG. 13, the auxiliary channel may be a monopole 1302 or a monopole having shaped arms 1304. The axis of symmetry 1306 for the dish is along the Z axis, as indicated by the XYZ axes. The focal point 1308 of the parabolic dish is denoted 'F', and the vertex 1310 denoted 'V'. FIG. 13 further illustrates plane waves 1312 having odd symmetry with respect to the XZ and YZ planes, and field vectors 1314/1316 having odd symmetry with respect to the XZ plane.

Figure 14:
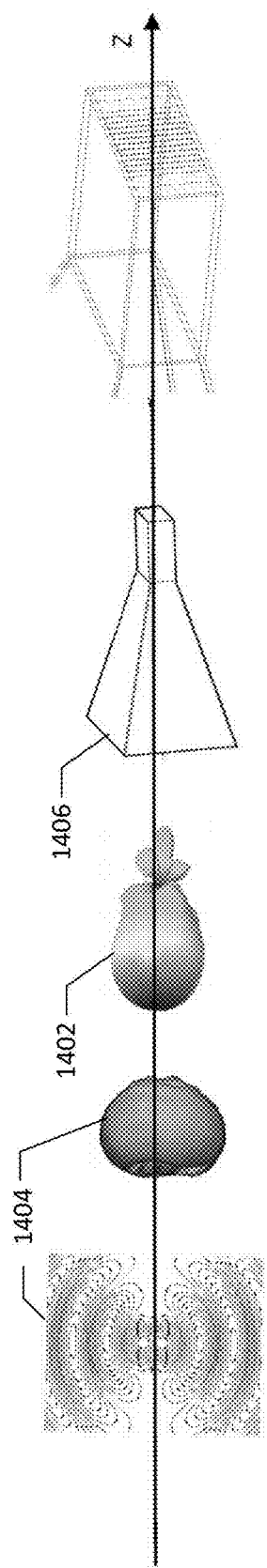
FIG. 14 depicts an example for various beams in accordance with some embodiments.
Figure 15:
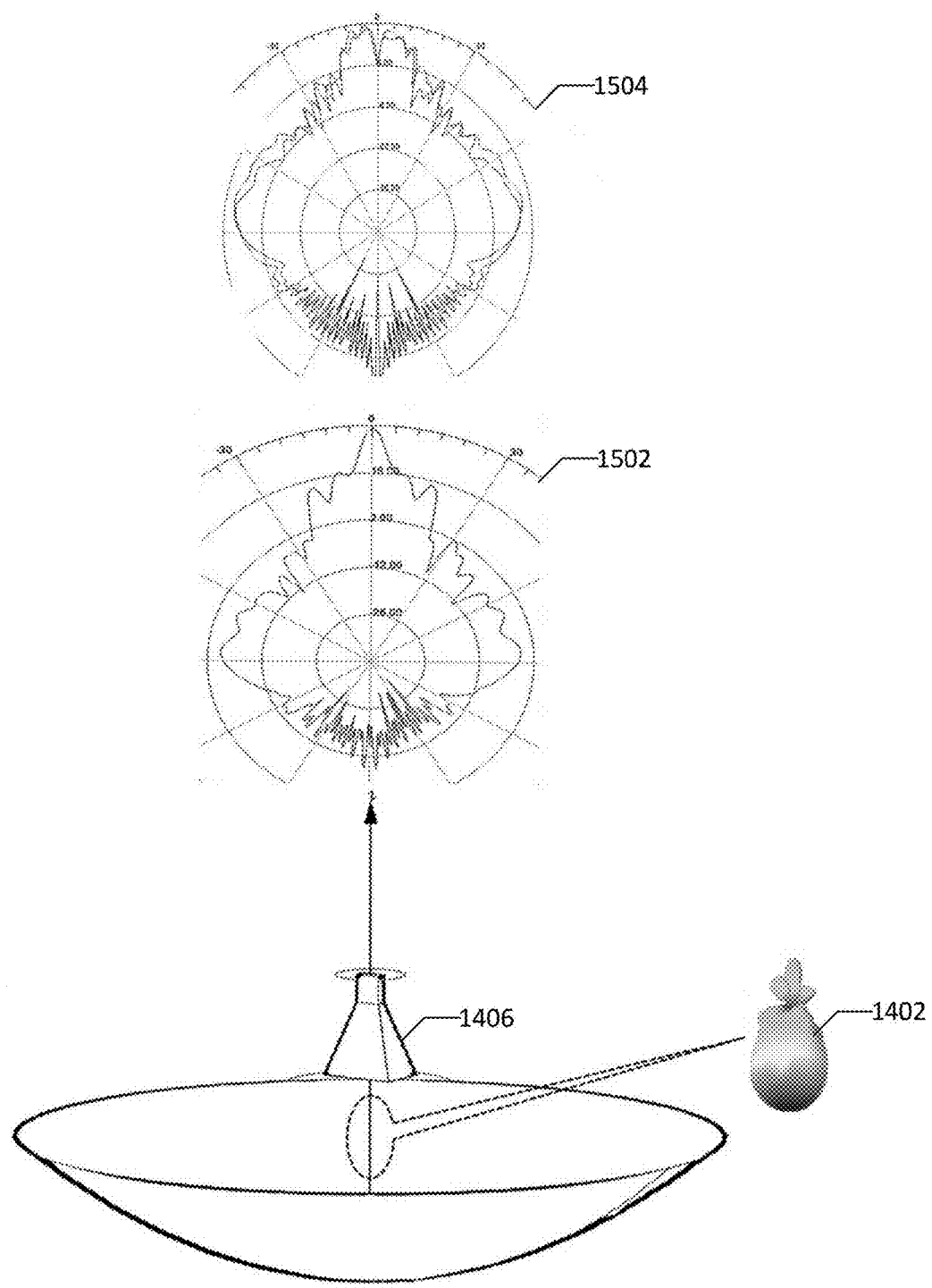
FIG. 15 depicts another example for various beams in accordance with some embodiments.
Figure 16:
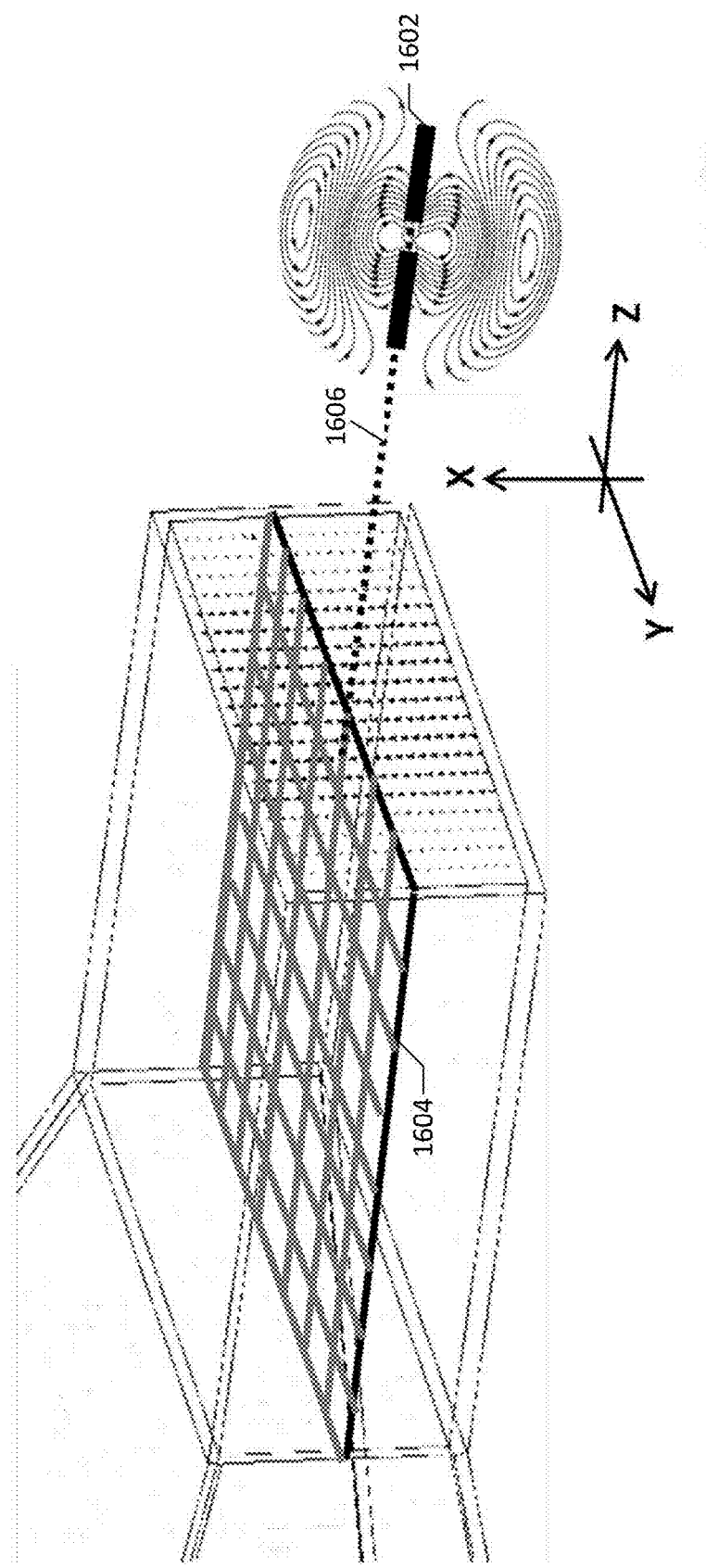
FIG. 16 is a pictorial view showing that are responsible for reduction in coupling, in accordance with some embodiments.

FIGS. 14, 15, and 16 are pictorial views of at least one embodiment embodiment where primary antenna including a parabolic dish is excited using a horn antenna. Specifically, FIG. 14 depicts a beam pattern 1402 of the excitation horn 1406 without the reflection in the dish reflector, and the decoupled beam pattern of the auxiliary channel 1404 without reflection in the dish reflector. FIG. 15 illustrates a graphical representation 1502 of the beam pattern 1402 of the excitation horn prior to reflecting from the dish, as well as a graphical representation 1504 of the decoupled beam pattern 1404 of the auxiliary channel after reflecting in the parabolic dish. FIG. 16 illustrates a plane of symmetry 1604 for one of two polarizations of the primary channel, and the corresponding alignment with the plane of symmetry 1606 of the dipole 1602.

Figure 17:
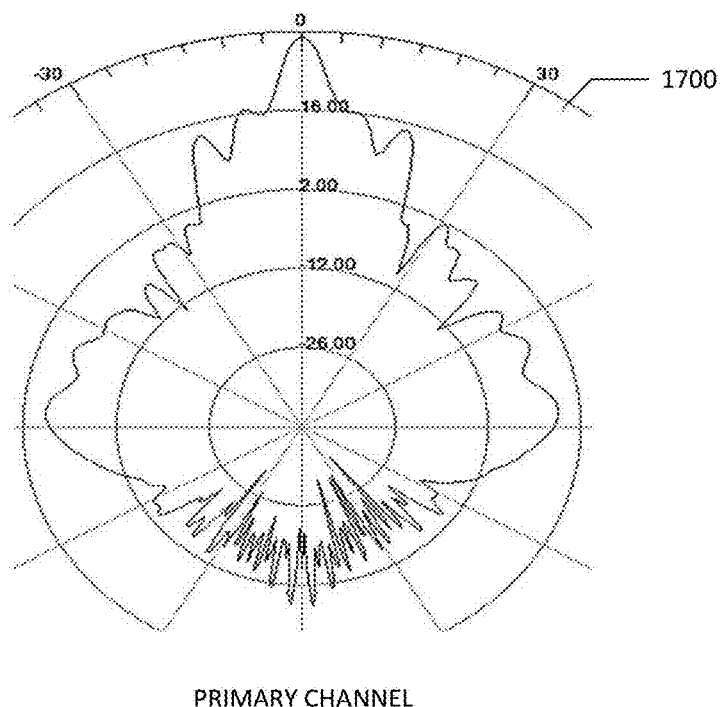
FIG. 17 is a pictorial view for the pattern of the primary channel, in accordance with some embodiments.
Figure 18:
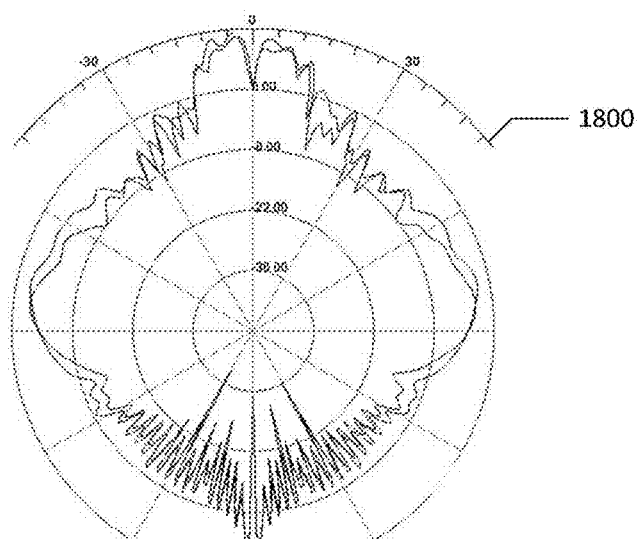
FIG. 18 is another pictorial view for the pattern of the auxiliary channel, in accordance with some embodiments.
Figure 19:
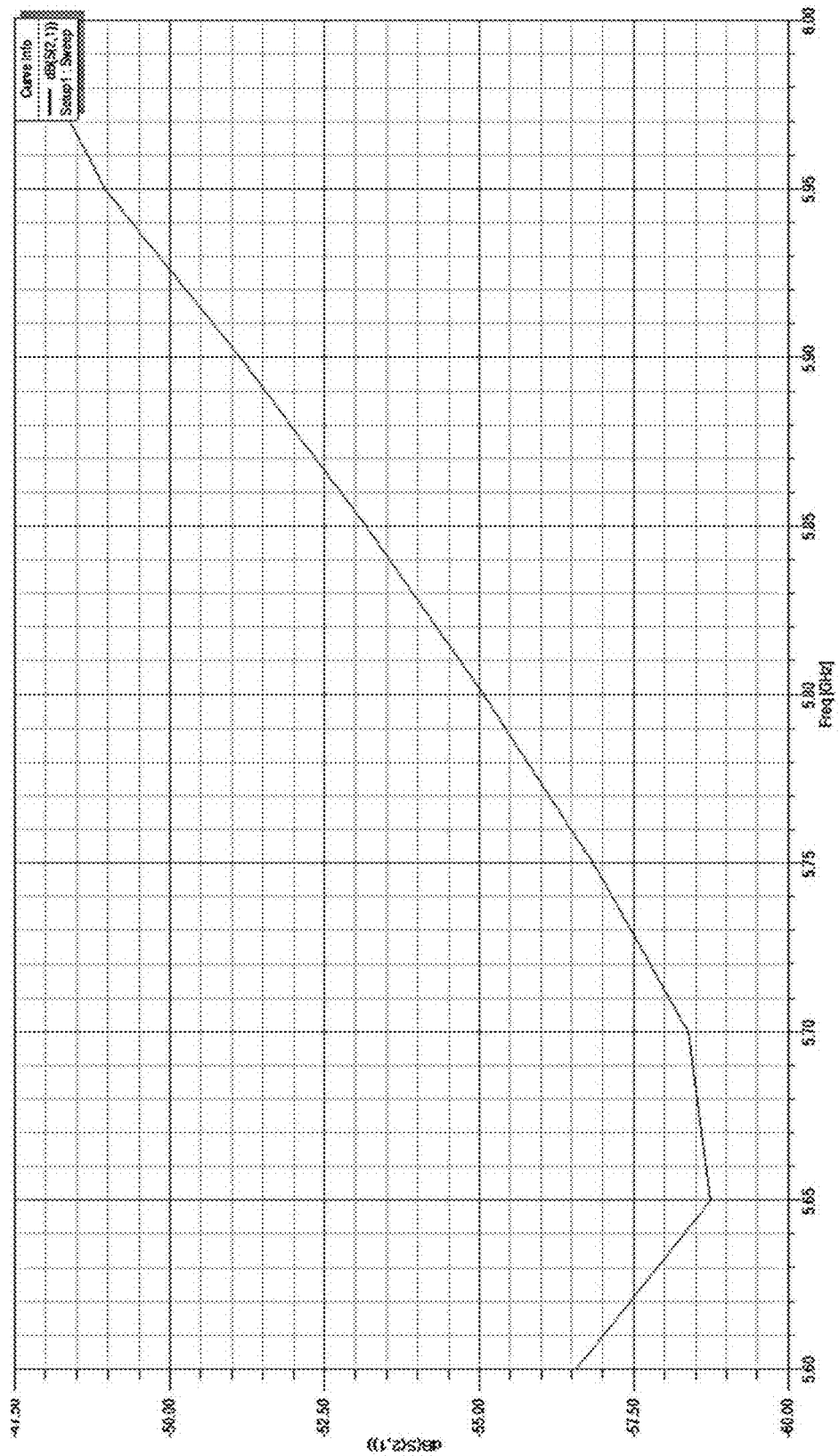
FIG. 19 depicts an exemplary coupling between the primary channel and the auxiliary channel computed using High Frequency Structural Simulator (HFSS), in accordance with some embodiments.

FIGS. 17 and 18 depict graphical views of radiation patterns for the primary channel 1700 and auxiliary channel 1800 of the aforementioned embodiments of FIGS. 14, 15, 16, respectively, and FIG. 19 depicts simulation results for the coupling between the primary and auxiliary channels.

Figure 20:
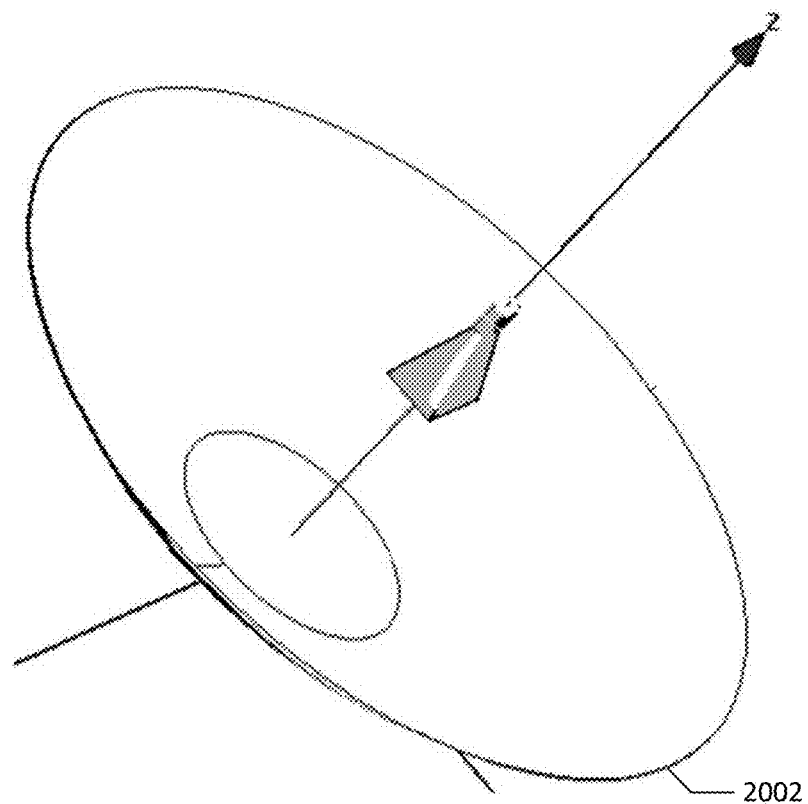
FIG. 20 depicts an exemplary shaping the parabolic reflector to improve the design objectives, in accordance with some embodiments.

FIG. 20 depicts an alternative geometry of a dish 2002, in accordance with some embodiments. As shown, the bottom of dish 2002 is flat an in the shape of a circle. Such a geometry may be used to improve the afore-mentioned design objectives.

Figure 21:
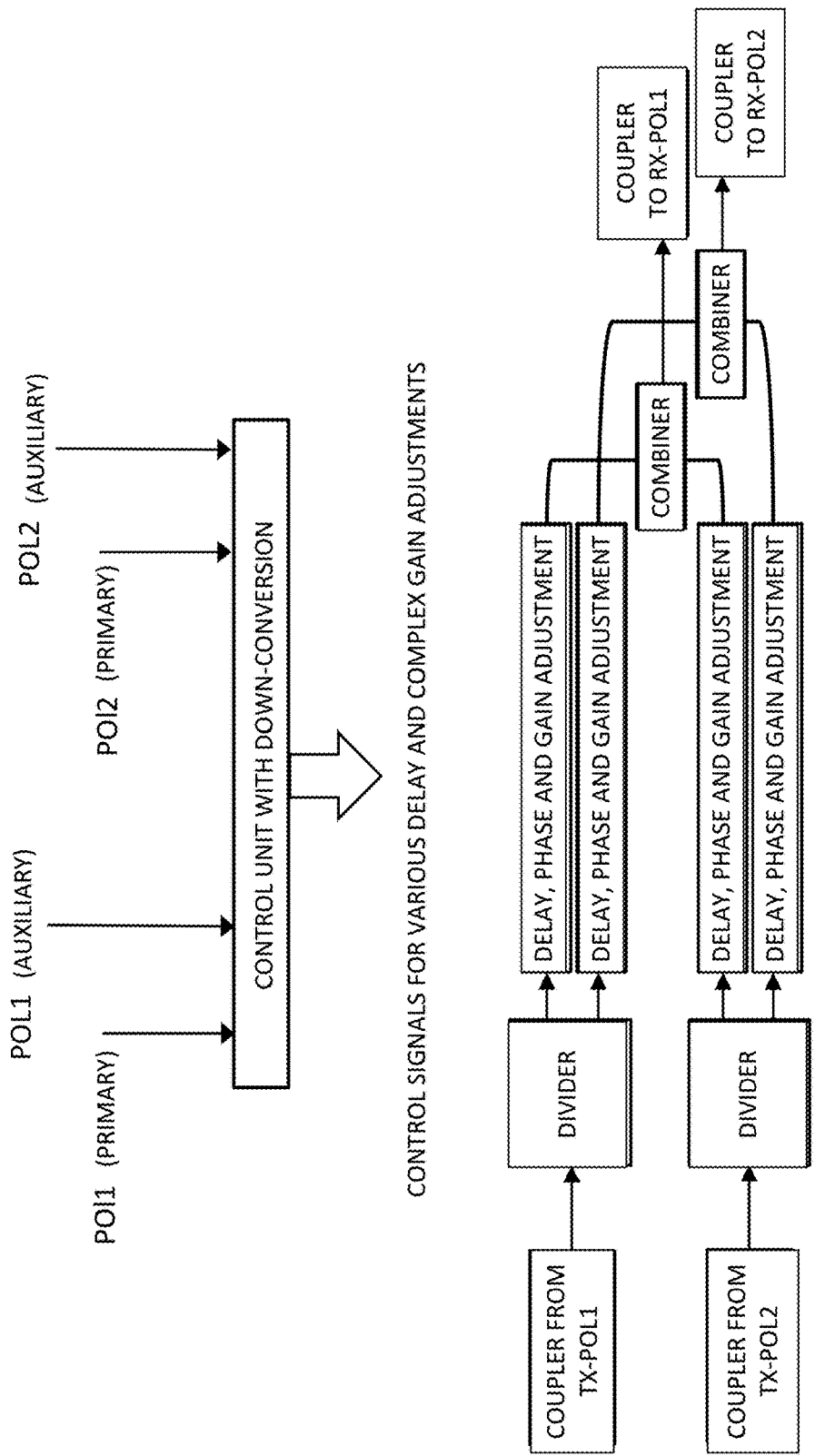
FIG. 21 depicts exemplary corrective circuitry, in accordance with some embodiments.

To further reduce the coupling, a corrective circuit may be added to create a corrective leakage between transmit and receive path(s). FIG. 21 is a block diagram of an exemplary corrective circuit, in accordance with some embodiments. As shown, adjustments of "Delay, Phase and Gain" in the corrective paths may be primarily static, while additional circuitry with dynamic adjustments may be deployed to adapt to variations in leakage. Note that such "dynamic variations" are mainly due to the changes in the reflection from the surrounding environment. As line of sight links are typically installed on high altitudes (such as towers or building roofs), the variations in the reflection from the environment may be small.

Figure 23:
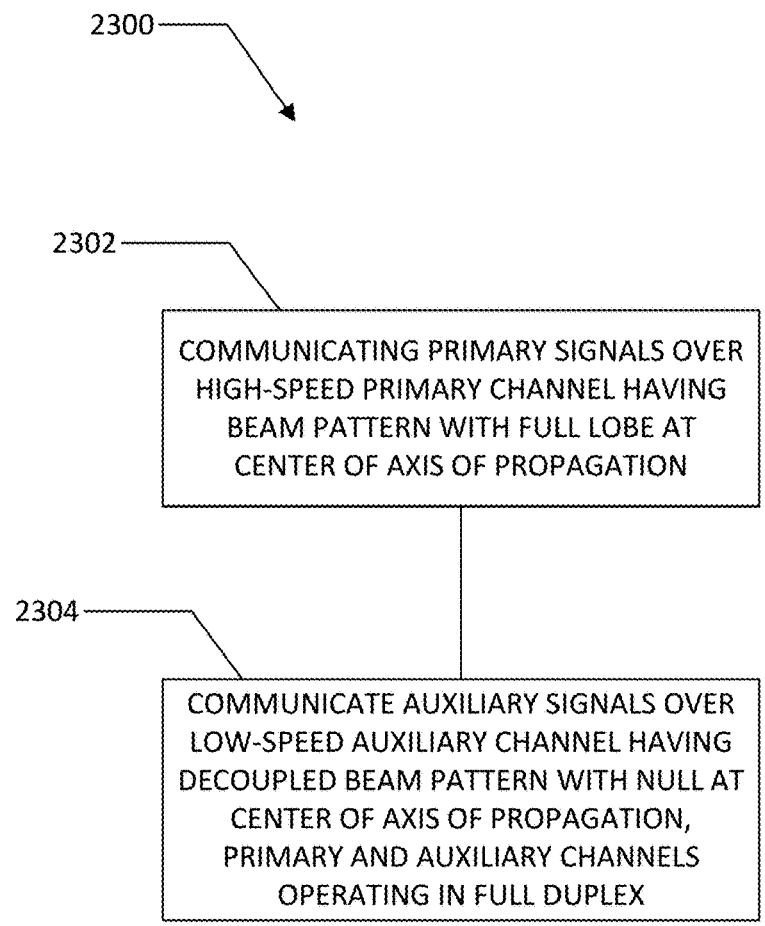
FIG. 23 is a flowchart of a method, in accordance with some embodiments.

FIG. 23 is a flowchart of a method 2300, in accordance with some embodiments. As shown, method 2300 includes communicating 2302 primary signals over a high-speed primary channel, the primary signals having a beam pattern having a full lobe at a center of an axis of propagation, and communicating 2304 auxiliary signals over a low-speed auxiliary channel, the auxiliary signals having a decoupled beam pattern having a null at the center of axis of propagation, the high-speed primary channel and low-speed auxiliary channel operating in full duplex. In some embodiments, the primary signals are communicated using a primary antenna including a dish antenna having an axis of symmetry corresponding to the axis of propagation. In such an embodiment, the auxiliary signals may be communicated via an auxiliary antenna having a monopole placed within the dish antenna, the monopole having an axis (i) orthogonal to an interior of the dish and (ii) aligned with the axis of symmetry of the dish antenna. In alternative embodiments, the auxiliary signals may be communicated via an auxiliary antenna having a dipole placed within the dish antenna, the dipole having an axis (i) orthogonal to an interior of the dish antenna, and (ii) aligned with the axis of symmetry of the dish antenna.

In some embodiments, the primary signals are communicated using single polarization, while alternative embodiments may communicate the primary signals using dual polarization. Similarly, some embodiments may communicate the auxiliary signals using single polarization. While alternative embodiments may communicate the auxiliary signals using dual polarization. In some embodiments, the auxiliary signals comprise control signals, such as signals used for training, frequency/clock synchronization and request for retransmission.

In some embodiments, the axis of propagation is misaligned with respect to a remote axis of propagation, as depicted by FIG. 22.

In some embodiments, a method for full-duplex point-to-point wireless communications, between points A and B includes points A and B both having a primary antenna with high directivity, and points A and B both having an auxiliary antenna symmetrically integrated within the primary antenna to have a low coupling to the primary antenna. A primary channel uses the antennas with high directivity to carrying main traffic, while an auxiliary channel uses the auxiliary antennas to carry a lower traffic, primarily for control of the primary channel including pilots for carrier synchronization.

In some embodiments, the primary channel includes a dish antenna and the auxiliary channel uses a monopole placed within the dish with its axis orthogonal to the interior of the dish, and aligned with the axis of symmetry of the dish. Alternatively, the auxiliary channel may include a dipole placed within the dish with its axis orthogonal to the interior of the dish, and aligned with the axis of symmetry of the dish. In some embodiments, the arms of the auxiliary antenna are symmetrically extended to have a projection parallel to the dish opening.

In some embodiments, the primary channel uses a polarization to support a single spatial data stream, and the auxiliary channel uses a single polarization to support a single spatial data stream. Alternatively, the primary channel supports two spatial data streams using dual polarization, and the auxiliary channel supports a single spatial data stream using single polarization. In a further such embodiment, the auxiliary channel may support two spatial data streams using dual polarization.

In some embodiments, the primary channel to supports two spatial data streams using dual polarization, and the auxiliary channel supports a single spatial stream using dual polarization. In such an embodiment, the signals from the two polarizations of the auxiliary channel may be relatively weighted and combined at the RF (Radio Frequency) in the receiving end of the auxiliary channel to reduce self-interference and improve SNR. Alternatively, the signals feeding the two polarizations of the auxiliary channel may be relatively weighted at the RF (Radio Frequency) in the transmitting end of the auxiliary channel to reduce the self-interference at the receiving end of the auxiliary channel to improve SNR. The two polarizations of the auxiliary channel may further be relatively weighted and combined at the RF (Radio Frequency) in the receiving end of the auxiliary channel to reduce self-interference and thus improve SNR.

In some embodiments, filtered versions of the signals in the primary and auxiliary channels are combined at RF (Radio Frequency) to reduce the coupling. In such embodiments, the filter coefficients may be computed by down-converting the primary and the auxiliary RF signals.

In some embodiments, directions of the primary channel and the auxiliary channels are switched depending on the amount of traffic in each direction, wherein, in one phase, the primary channel is from A-to-B and the auxiliary channel is from B-to-A, and in a complementary phase, the primary channel is from B-to-A and the auxiliary channel is from A-to-B. In some embodiments, an axis of symmetry of the two ends A and B are shifted and/or rotated with respect to each other to maximize signal-to-noise ratios at both ends.

In the foregoing specification, specific embodiments have been described. However, one of ordinary skill in the art appreciates that various modifications and changes can be made without departing from the scope of the described embodiments as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The described embodiments are defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be composed of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

I claim:

1. An apparatus comprising:
a primary antenna for communication via a high-speed primary channel via signals having a beam pattern having a full lobe at a center of an axis of propagation of the signals; and
an auxiliary antenna for communication via a low-speed auxiliary channel via signals having a decoupled beam pattern having a null at the center of axis of propagation of the signals, the high-speed primary channel and low-speed auxiliary channel operating in full duplex.

2. The apparatus of claim 1, wherein the primary antenna comprises a dish antenna having an axis of symmetry corresponding to the axis of propagation.

3. The apparatus of claim 2, wherein the auxiliary antenna comprises a monopole placed within the dish antenna, the monopole having an axis (i) orthogonal to an interior of the dish and (ii) aligned with the axis of symmetry of the dish antenna.

4. The apparatus of claim 2, wherein the auxiliary antenna comprises a dipole placed within the dish antenna, the dipole having an axis (i) orthogonal to an interior of the dish antenna, and (ii) aligned with the axis of symmetry of the dish antenna.

5. The apparatus of claim 2, wherein the auxiliary antenna comprises symmetrically extended arms for propagation of the signals parallel to an opening of the dish antenna.

6. The apparatus of claim 1, wherein the high-speed primary channel is single polarized.

7. The apparatus of claim 1, wherein the high-speed primary channel is dual polarized.

8. The apparatus of claim 1, wherein the low-speed auxiliary channel is single polarized.

9. The apparatus of claim 1, wherein the low-speed auxiliary channel is dual polarized.

10. The apparatus of claim 1, wherein the axis of propagation is offset with respect to a second axis of propagation of a remote primary antenna.

11. A method comprising:
communicating primary signals over a high-speed primary channel, the primary signals having a beam pattern having a full lobe at a center of an axis of propagation; and
communicating auxiliary signals over a low-speed auxiliary channel, the auxiliary signals having a decoupled beam pattern having a null at the center of axis of propagation, the high-speed primary channel and low-speed auxiliary channel operating in full duplex.

12. The method of claim 11, wherein the primary signals are communicated using a primary antenna, the primary antenna comprising a dish antenna having an axis of symmetry corresponding to the axis of propagation.

13. The method of claim 12, wherein the auxiliary signals are communicated via an auxiliary antenna comprising a monopole placed within the dish antenna, the monopole having an axis (i) orthogonal to an interior of the dish and (ii) aligned with the axis of symmetry of the dish antenna.

14. The method of claim 12, wherein the auxiliary signals are communicated via an auxiliary antenna comprising a dipole placed within the dish antenna, the dipole having an axis (i) orthogonal to an interior of the dish antenna, and (ii) aligned with the axis of symmetry of the dish antenna.

15. The method of claim 11, wherein the primary signals are communicated using single polarization.

16. The method of claim 11, wherein the primary signals are communicated using dual polarization.

17. The method of claim 11, wherein the auxiliary signals are communicated using single polarization.

18. The method of claim 11, wherein the auxiliary signals are communicated using dual polarization.

19. The method of claim 11, wherein the auxiliary signals comprise control signals.

20. The method of claim 11, wherein the axis of propagation is misaligned with respect to a remote axis of propagation.

* * * * *